United States Patent
Anderton

(10) Patent No.: US 10,091,582 B2
(45) Date of Patent: Oct. 2, 2018

(54) SIGNAL ENHANCEMENT

(71) Applicant: Gibson Brands, Inc., Nashville, TN (US)

(72) Inventor: Craig Anderton, Nashville, TN (US)

(73) Assignee: Gibson Brands, Inc., Nashville, TN (US)

( * ) Notice: Subject to any disclaimer, the term of this patent is extended or adjusted under 35 U.S.C. 154(b) by 144 days.

(21) Appl. No.: 15/217,990

(22) Filed: Jul. 23, 2016

(65) Prior Publication Data
US 2018/0027326 A1    Jan. 25, 2018

(51) Int. Cl.
*H03G 3/00* (2006.01)
*H04R 3/04* (2006.01)
*H03F 3/183* (2006.01)

(52) U.S. Cl.
CPC .............. *H04R 3/04* (2013.01); *H03F 3/183* (2013.01); *H03F 2200/165* (2013.01); *H03F 2200/171* (2013.01)

(58) Field of Classification Search
CPC ....................................................... H03G 3/00
See application file for complete search history.

(56) References Cited

U.S. PATENT DOCUMENTS

| 4,647,876 A * | 3/1987 | Waller, Jr. ............. H03G 9/025 330/280 |
| 6,993,480 B1 * | 1/2006 | Klayman ............ G10L 21/0364 704/225 |
| 2006/0147056 A1 | 7/2006 | Klayman |
| 2006/0274903 A1 * | 12/2006 | Aoki ........................ H04R 3/00 381/56 |
| 2008/0118071 A1 | 5/2008 | Trautmann |

FOREIGN PATENT DOCUMENTS

EP    0748143 B1    11/2001

OTHER PUBLICATIONS

Nho, Ji Myong, International Search Report & Written Opinion, dated Oct. 25, 2017, pp. 1-14, International Application Division, Korean Intellectual Property Office, Daejeon, Republic of Korea.

* cited by examiner

*Primary Examiner* — Olisa Anwah
(74) *Attorney, Agent, or Firm* — Bates & Bates, LLC

(57) ABSTRACT

A piece of audio equipment is provided that includes a first signal path including a first dynamic range expander and a lowpass filter. The piece of audio equipment also includes a second signal path parallel to the first signal path, wherein the second signal path includes a second dynamic range expander and a highpass filter. The piece of audio equipment further includes a summing amplifier configured to receive a first signal from the first signal path, a second signal from the second signal path, and a clear signal from an audio source and output a summed signal.

20 Claims, 5 Drawing Sheets

US 10,091,582 B2

SIGNAL ENHANCEMENT

BACKGROUND

Human hearing is subject to a variety of eccentricities. For example, at low levels of loudness, midrange frequencies in an audio signal can be perceived by the ear/brain combination as being more prominent than high and low frequencies in the audio signal. Similarly, when the volume of the audio signal is increased, the ear/brain combination can perceive the low and high frequencies in the audio signal as being more prominent than at lower volume levels.

SUMMARY

In an example embodiment, a signal processor is provided that includes a first signal path from an audio source including a first dynamic range expander and a lowpass filter. The signal processor also includes a second signal path from the audio source including a second dynamic range expander and a highpass filter, and a third signal path from the audio source.

In another example embodiment, a piece of audio equipment is provided with a first signal path including a first dynamic range expander and a lowpass filter. The piece of audio equipment also comprises a second signal path parallel to the first signal path, wherein the second signal path includes a second dynamic range expander and a highpass filter. The piece of audio equipment further includes a summing amplifier configured to receive a first signal from the first signal path, a second signal from the second signal path, and a clear signal, and output a summed signal.

In yet another example embodiment, a computer-readable tangible medium is provided with instructions stored thereon that, when executed, direct a processor to dynamically expand the range of a signal received from an audio source to create a dynamically expanded signal. The computer-readable tangible medium also has instructions stored thereon that, when executed, direct the processor to filter the dynamically expanded signal through a lowpass filter to create a first processed signal, and filter in parallel the dynamically expanded signal through a highpass filter to create a second processed signal.

This summary is not intended to identify key or essential features of the claimed subject matter, nor is it intended to be used as an aid in limiting the scope of the claimed subject matter.

Other features of the current disclosure will become apparent to those skilled in the art upon review of the following drawings, the detailed description, and the appended claims.

BRIEF DESCRIPTION OF THE DRAWINGS

Illustrative embodiments will be described referring to the accompanying drawings, wherein like numerals denote like elements.

DETAILED DESCRIPTION

In the following description, numerous details are set forth to provide an understanding of some embodiments of the present disclosure. However, it will be understood by those of ordinary skill in the art that the systems and/or methodologies may be practiced without these details and that numerous variations or modifications from the described embodiments may be possible.

As described herein, various techniques and technologies associated with signal enhancement can be used to compensate for deficiencies in human hearing, recording processes, etc., by accentuating dynamics in tonal ranges where human hearing, recorded audio signals, etc., are deficient. In one possible implementation, such accentuation can make an audio signal clearer to a listener. In another possible implementation, such accentuation can make an audio signal appear more alive, engendering an improved emotional response in a listener. In another possible implementation, the listening experience can be improved for those who have suffered damage to their hearing through various events, including, for example, excessive noise exposure, aging, etc.

Example Signal Processing

Figure 1:
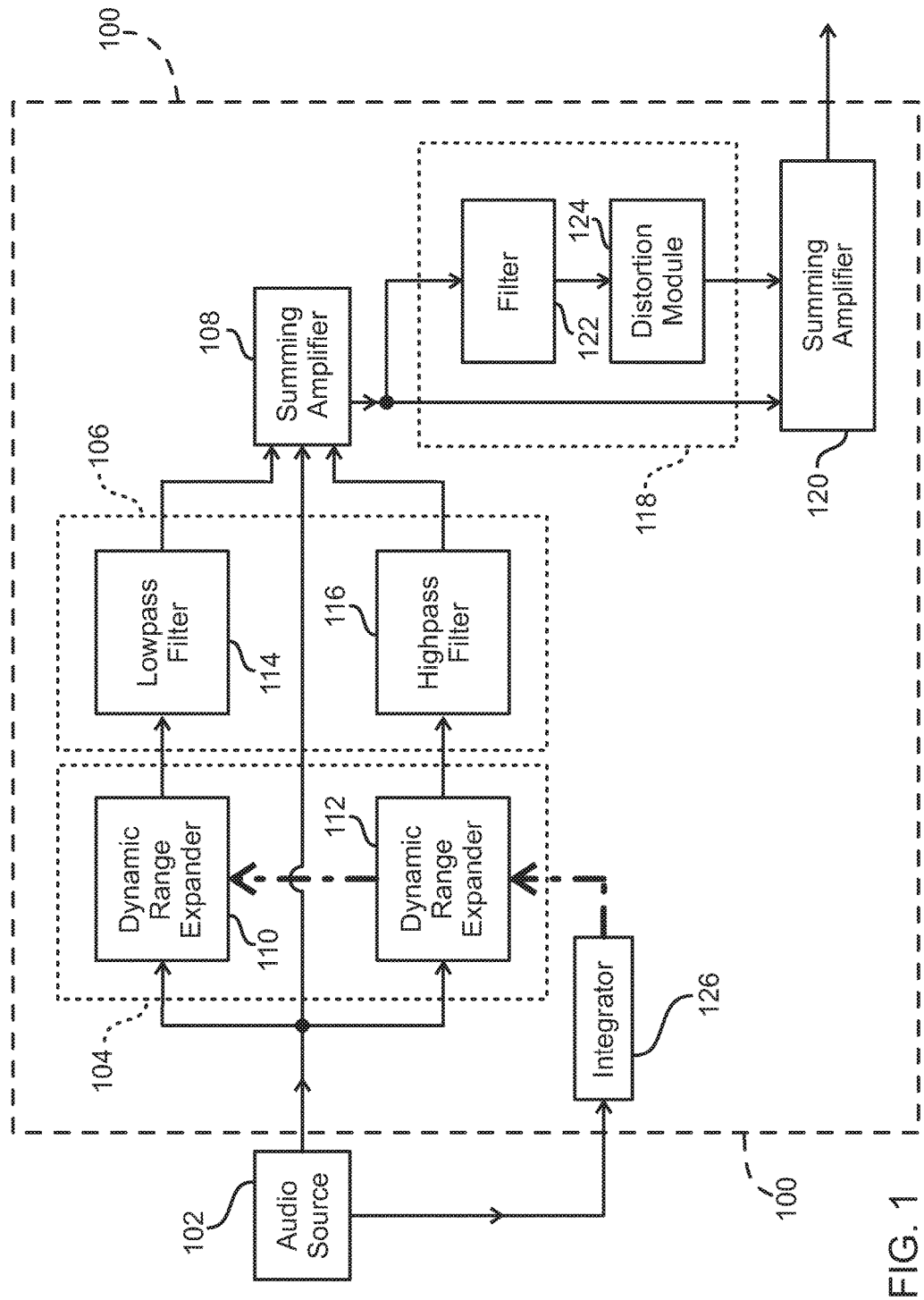
FIG. 1 illustrates example signal processor(s) in accordance with various implementations of signal enhancement.

FIG. 1 illustrates an example signal processor 100 in accordance with various implementations of signal enhancement. Signal processor 100 can be used on its own or it can be incorporated into any audio equipment known in the art, including, for example, musical instruments, mixers, cellphones, computers, public address systems, speakers (including headphones), entertainment systems, televisions, etc.

As shown, signal processor 100 can accept an audio signal from an audio source 102. Audio source 102 can include any signal source or other device capable of creating, accepting, storing, transmitting, manipulating, sensing, recording, etc., an audio signal, including, for example, a microphone, a guitar pickup, a bass guitar pickup, a computer readable memory, a synthesizer, a keyboard, a communication device, a public address system, an audio playback device, etc.

In one possible implementation, one or more instances of an audio signal from audio source 102 can be accepted and processed by a transient shaping and expanding module 104 before being passed to an equalization enhancement module 106. After being further processed by the equalization enhancement module 106, the one or more instances of the audio signal can be sent to a summing amplifier 108, where, in one possible implementation, the one or more instances of the audio signal can be summed with a clear, unprocessed instance of the audio signal from audio source 102 into a summed signal. In such a manner, the various tonal ranges in the original audio signal from audio source 102 can be boosted dynamically as the audio signal is played, resulting in a clearer, crisper and more alive audio signal output to a user. Summing amplifier 108 can include any summing amplifier known in the art.

In one possible implementation, transient shaping and expanding module 104 can include one or more dynamic range expanders 110, 112. For example, in the event the audio signal from audio source 102 is split, one instance of the audio signal can be transmitted to dynamic range expander 110, while another instance of the audio signal can be transmitted to dynamic range expander 112. Dynamic range expanders 110, 112 can comprise any dynamic range expanders and/or expanders known in the art, including any combination of thereof.

In one possible implementation, equalization enhancement module 106 can comprise one or more filters 114, 116. These can include, for example, a lowpass filter 114 and a highpass filter 116, though any other types of filters known in the art, including any possible combination thereof, can also be used. It will be understood that the term "lowpass filter", as used herein, includes any technology, or combination of technologies, capable of passing low frequencies. Similarly, it will be understood that the term "highpass filter", as used herein, includes any technology, or combination of technologies, capable of passing high frequencies.

In one possible implementation, the summed signal from summing amplifier 108 can be accepted by an excitation module 118 for further processing before being passed to a second summing amplifier 120. Second summing amplifier 120 can include any summing amplifier known in the art and excitation module 118 can include any excitation technology known in the art. In one possible implementation, excitation module 118 can include functionality configured to distort a received signal and generate harmonics.

For example, in one possible embodiment, excitation module 118 can include a filter 122 and a distortion module 124. Filter 122 can include any type of filter known in the art, or any possible combination thereof, including for example, one or more bandpass filters, a 10 kHz highpass filter, etc. Similarly, distortion module 124 can include any type of distortion functionality known in the art, including any possible combination thereof. This can include, for example, a second harmonic distortion module.

It will be understood that second summing amplifier 120 and summing amplifier 108 can comprise two separate summing amplifiers. Alternately, or additionally, second summing amplifier 120 and summing amplifier 108 can comprise a single summing amplifier called at different points during the processing of audio signals in signal processor 100.

As illustrated in FIG. 1, in one possible implementation, the audio signal from audio source 102 can be split into multiple paths. In one possible embodiment, one or more paths can run through, and be subjected to processing by, transient shaping and expanding module 104 and equalization enhancement module 106, while one or more other paths can be clean, such that signals on these other paths are not subjected to processing by transient shaping and expanding module 104 and equalization enhancement module 106.

For instance, in one possible implementation, an instance of an audio signal from audio source 102 on a first signal path can be transmitted to dynamic range expander 110 in transient shaping and expanding module 104, before being transmitted to lowpass filter 114 in equalization enhancement module 106. In one possible aspect, the type, magnitude, etc., of processing of the audio signal in transient shaping and expanding module 104 and/or equalization enhancement module 106 (including, for example, the parameters of lowpass filter 114) can be chosen based on a given frequency response curve.

Similarly, an instance of the audio signal from audio source 102 on a second signal path can be transmitted to dynamic range expander 112 in transient shaping and expanding module 104, before being transmitted to highpass filter 116 in equalization enhancement module 106. In one possible aspect, the type, magnitude, etc., of processing of the audio signal in transient shaping and expanding module 104 and/or equalization enhancement module 106 (including, for example, the parameters of highpass filter 116) can be chosen based on a given frequency response curve.

Figure 2:
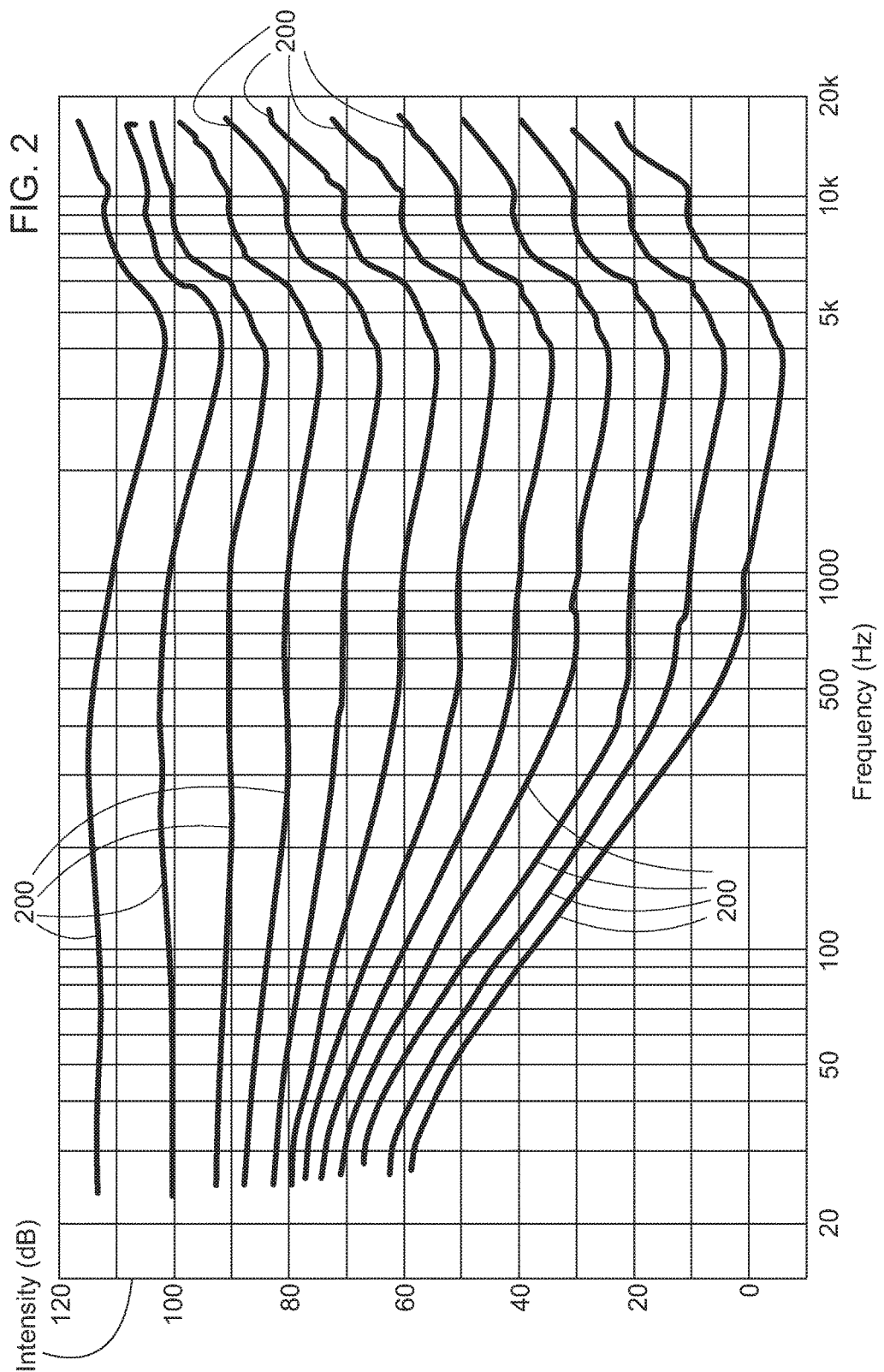
FIG. 2 illustrates example frequency response equal response curves for the human ear at different level intensities.

FIG. 2 illustrates example frequency response curves 200 that can be used to tailor the processing performed in transient shaping and expanding module 104 (including for example the choosing of expansion ratios of dynamic range expanders 110, 112) and/or in equalization enhancement module 106 (including, for example, the determination of parameters of filters such as highpass filter 116, lowpass filter 114, etc.) in accordance with various implementations of signal enhancement. For example, in some possible implementations, a desired expansion ratio in dynamic range expanders 110, 112 can be pursued while listening to music while other desired expansion ratios in dynamic range expanders 110, 112 can be used to create more or less dramatic effects in association with various musical instruments, etc.

Frequency response curves 200 illustrated in FIG. 2 correspond to Fletcher-Munson equal loudness contours associated with human hearing. From such curves, rolloff points in human hearing for various frequencies can be determined.

In addition to, or in place of, Fletcher-Munson curves, any other frequency response curves 200 known in the art may also be used, including, for example, frequency response curves 200 associated with human hearing in various age groups. Frequency response curves 200 associated with various audio equipment, such as guitar pickups, bass pickups, microphones, etc., can also be used. In such instances, rolloff points associated with particular frequency responses of the various audio equipment can be determined, and equalization enhancement module 106 can be customized to process signals produced by such audio equipment.

Returning to FIG. 1, in one possible implementation, in order to tailor signal processor 100 to human hearing, highpass filter 116 can be chosen to have a corner frequency correlating to a high-frequency rolloff point in human hearing as defined by, for example, the Fletcher-Munson curve, such as for example, an octave slope between 3-96 dB. Such a configuration can be used to boost the frequency range in the audio signal on the second signal path being processed by highpass filter 116, and enhance dynamics within that range. In one possible implementation, such boosting can be done intelligently with dynamic range expansion.

Additionally, to further tailor signal processor 100 to human hearing, lowpass filter 114 can be chosen to have a corner frequency correlating to a low-frequency rolloff point in human hearing, as defined by, for example, the Fletcher-Munson curve, such as for example, an octave slope between 3-96 dB. Such a configuration can be used to boost the frequency range in the audio signal on the first signal path being processed by lowpass filter 114, and enhance dynamics within that range. In one possible implementation, such boosting can be done intelligently with dynamic range expansion.

Continuing with this example, in one possible implementation, a third signal path can be added in signal processor 100 through excitation module 118 with filter 122 comprising a sharp highpass filter (such as a highpass filter having, for example, a 36 dB/octave slope with a corner frequency of 10 kHz), followed by distortion module 124. In one possible implementation, the configuration of distortion module 124 can be chosen to create high-frequency harmonics in, for example, the 10-20 kHz range.

In one possible implementation, signal processor 100 can be configured such that dynamic range expansion does or does not occur in the third signal path. For example, in addition to a signal path through excitation module 118 in which processing takes place, a parallel signal path can exist in excitation module 118 in which no processing takes place, such that after both paths leave excitation module 118, they can be summed in summing amplifier 120.

Also, in one possible aspect, one or more of the signal paths in signal processor 100 can include an option level control allowing a user to, for example, vary the amount of audio effects associated with the one or more signal paths. Alternately, or additionally, several presets for common scenarios can exist for one or more of the signal paths in signal processor 100.

In yet another possible implementation, an integrator 126 can be employed to institute an automatically floating threshold for one or more elements in transient shaping and expanding module 104, including, for example, dynamic range expanders 110, 112. In such a configuration, a user would not have to set the dynamic range expansion behavior by doing a manual adjustment, but instead could be provided with a single button that would turn on the floating threshold option, which would automatically improve and/or optimize the dynamic range expansion behavior. Once turned on, the floating threshold can automatically follow the audio signal from audio source 102 and trigger expansion of the audio signal at the dynamic range expanders 110, 112 when desired.

For example, in one possible embodiment, the floating threshold can be set in integrator 126 such that dynamic range expanders 110, 112 are always working based on an average dynamic range of an audio signal being fed to transient shaping and expanding module 104 from audio source 102. In such a manner, the threshold could be set once and be suitable for many disparate types of audio signals, such as, for example, classical music, which has a wide dynamic range, and pop music, which has a narrower dynamic range.

In another possible implementation, in the absence of such a floating threshold, a user could manually manipulate transient shaping and expanding module 104 to choose a suitable threshold at which dynamic range expanders 110, 112 can expand an audio signal. For example, a single control could be provided allowing a user to set an amount of enhancement to be added by transient shaping and expanding module 104. The user could then vary this threshold on the fly while listening to the audio signal, if desired.

Example Methods

Figure 3:
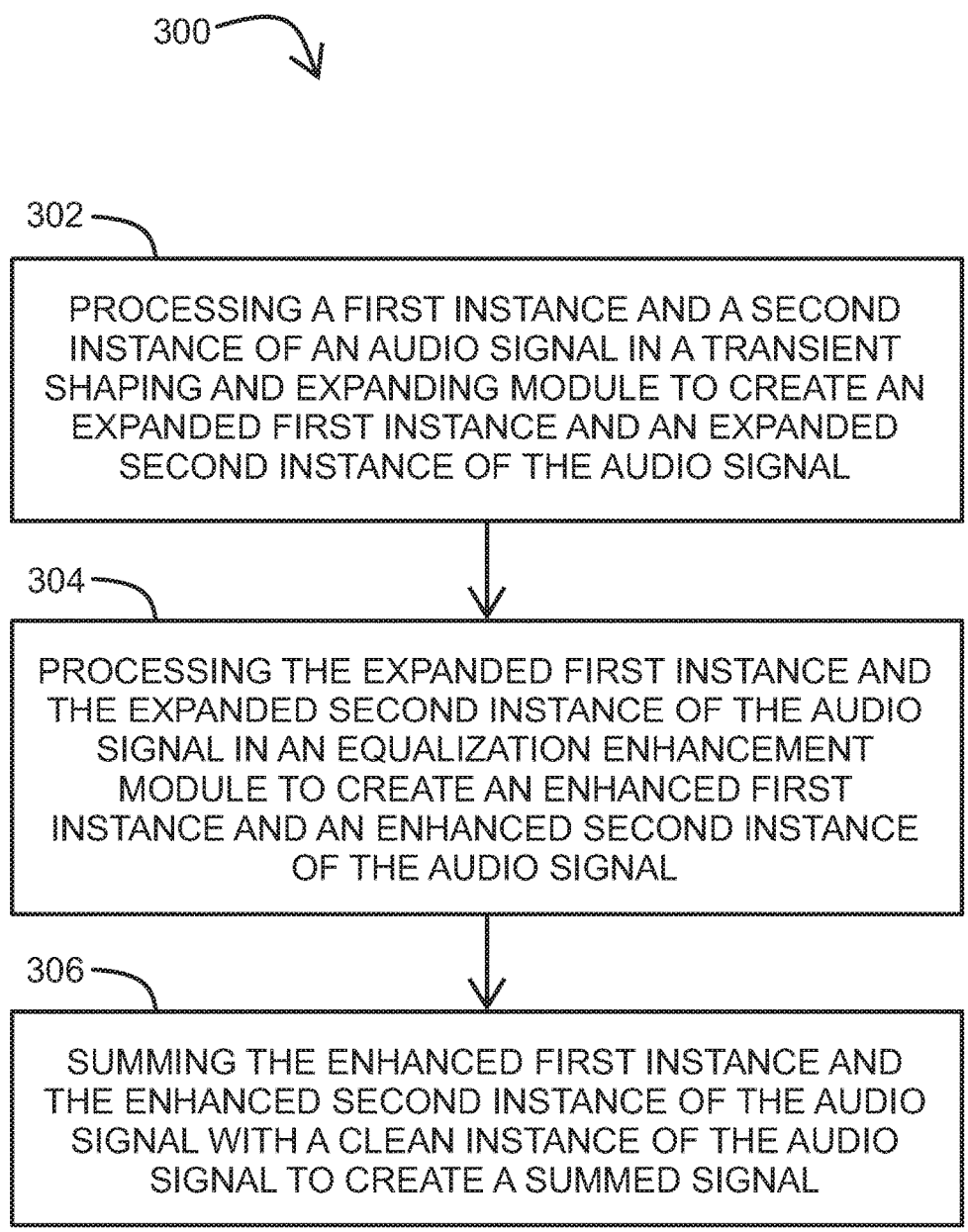
FIG. 3 illustrates example method(s) associated with various embodiments of signal enhancement.
Figure 4:
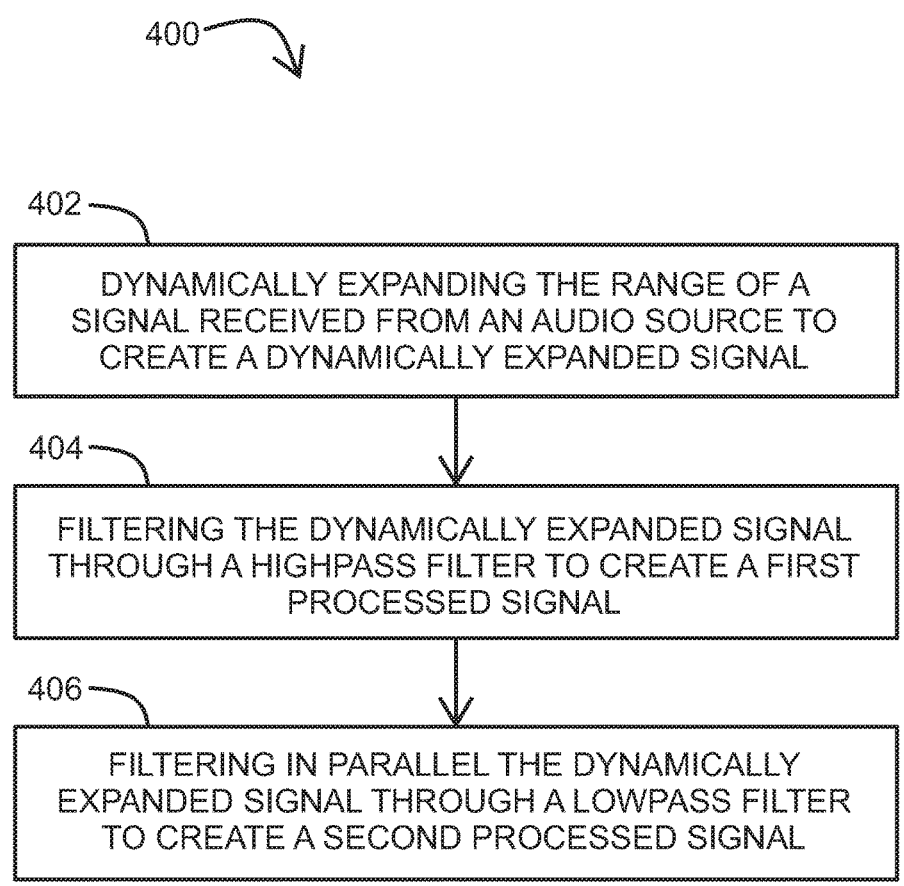
FIG. 4 illustrates example method(s) associated with various embodiments of signal enhancement.

FIGS. 3-4 illustrate example methods for implementing aspects of signal enhancement. The methods are illustrated as a collection of blocks and other elements in a logical flow graph representing a sequence of operations that can be implemented in hardware, software, firmware, various logic or any combination thereof. The order in which the methods are described is not intended to be construed as a limitation, and any number of the described method blocks can be combined in any order to implement the methods, or alternate methods. Additionally, individual blocks and/or elements may be deleted from the methods without departing from the spirit and scope of the subject matter described therein. In the context of software, the blocks and other elements can represent computer instructions that, when executed by one or more processors, perform the recited operations. Moreover, for discussion purposes, and not purposes of limitation, selected aspects of the methods may be described with reference to elements shown in FIGS. 1-2 and FIG. 5.

FIG. 3 illustrates an example method 300 associated with embodiments of signal enhancement. At block 302 a first instance and a second instance of an audio signal, such as an audio signal output by audio source 102, is processed in a transient shaping and expanding module, such as transient shaping and expanding module 104, to create an expanded first instance and an expanded second instance of the audio signal. In one possible aspect, the first instance and second instance of the audio signal are processed by dynamic range expanders, such as dynamic range expanders 110, 112, in the transient shaping and expanding module.

At block 304, the expanded first instance and the expanded second instance of the audio signal are transmitted from the transient shaping and expanding module to an equalization enhancement module, such as equalization enhancement module 106. At the equalization enhancement module the expanded first instance and the expanded second instance of the audio signal are processed to create an enhanced first instance and an enhanced second instance of the audio signal. In one possible aspect, this can be accomplished by passing the expanded first instance and the expanded second instance of the audio signal through one or more filters, such as lowpass filter 114 and/or high pass filter 116. The filters can be designed based on one or more frequency response curves, such as frequency response curves 200, to boost the loudness of desired tonal ranges in the expanded first instance and the expanded second instances of the audio signal.

At block 306, the enhanced first instance and the enhanced second instance of the audio signal can be summed with a clean instance of the audio signal to create a summed signal. This summed signal can have various boosted tonal ranges, resulting in a clearer and more alive sounding audio signal output to a user. In one possible implementation, the summed signal can be further transmitted to an excitation module, such as excitation module 118, where the summed signal can be augmented with harmonics, such as high frequency harmonics.

FIG. 4 illustrates an example method 400 associated with embodiments of signal enhancement. At block 402 the range of a signal received from an audio source, such as audio source 102, is expanded to create a dynamically expanded signal. In one possible implementation, the signal is expanded by one or more dynamic range expanders, such as dynamic range expanders 110, 112.

At block 404, one instance of the dynamically expanded signal is filtered through a highpass filter, such as highpass filter 116 to create a first processed signal.

At block 406, a second instance of the dynamically expanded signal is filtered in parallel through a lowpass filter, such as lowpass filter 114 to create a second processed signal.

In one possible implementation, performance of the highpass filter and the lowpass filter can be set based on one or more frequency response curves, such as frequency response curves 200. For example, to tailor the first processed signal to human hearing, the highpass filter can be chosen to have a corner frequency correlating to a high-frequency rolloff point in human hearing as defined by, for example, the Fletcher-Munson equal-loudness contours, such as for example, an octave slope between 6-48 dB (including for example 24 dB). Similarly, to tailor the second processed signal to human hearing, the lowpass filter can be chosen to have a corner frequency correlating to a low-frequency rolloff point in human hearing, as defined by, for example, the Fletcher-Munson equal loudness contours, such as for example, an octave slope between 3-96 dB (including for example 24 dB).

In one possible implementation, the first processed signal and the second processed signal can be summed with a clean instance of the audio signal from the audio source at a summing amplifier, such as summing amplifier 108, to create a summed signal comprising the original audio signal from the audio source with boosted loudness levels of various frequencies via the processing performed at the dynamic range expander and the highpass and lowpass filters. The term "clean", as used herein with regard to an audio signal can mean that the audio signal has yet to be processed.

Example Computing Device(s)

Figure 5:
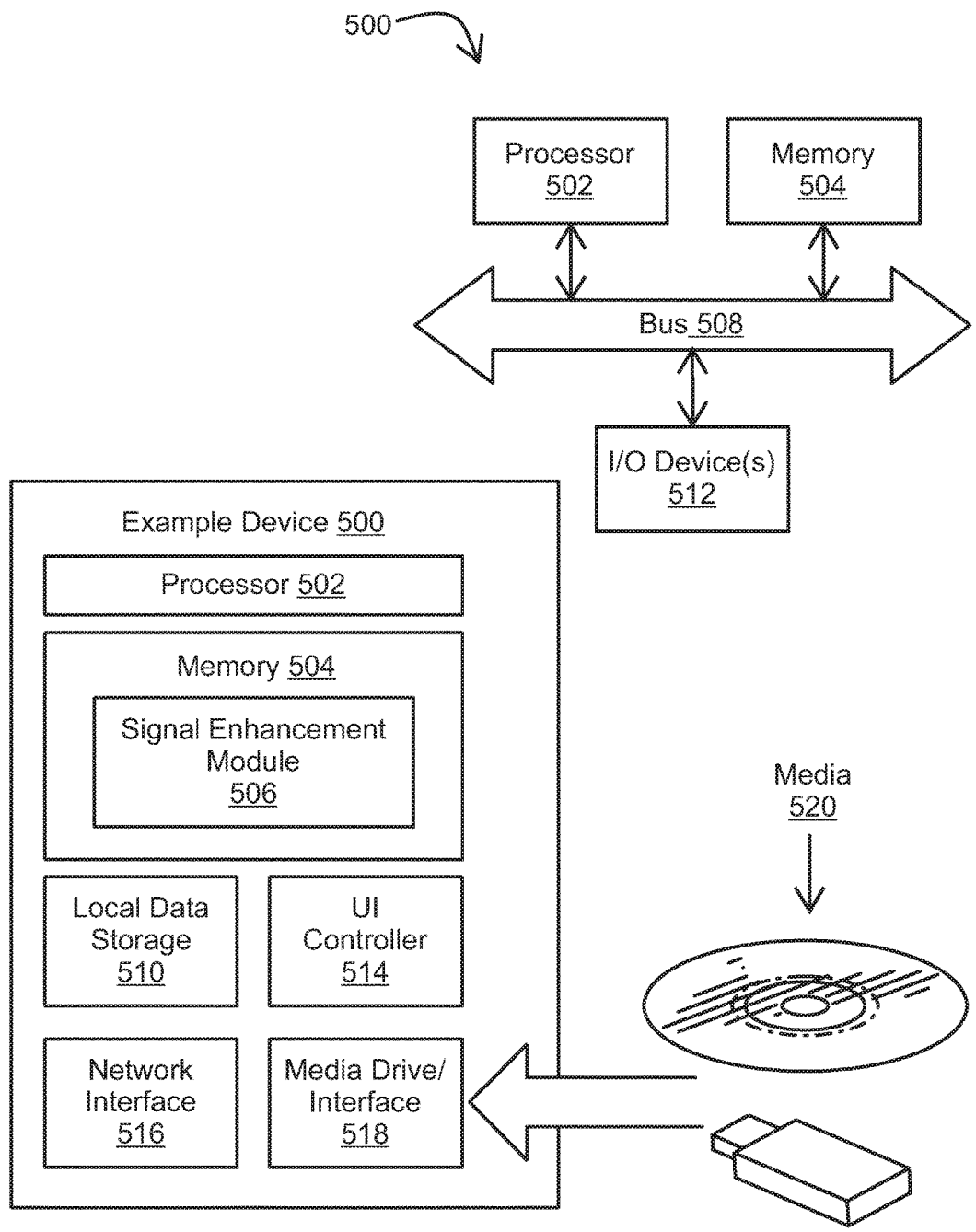
FIG. 5 illustrates an example computing device that can be used in accordance with various implementations of signal enhancement.

FIG. 5 illustrates an example device 500, with a processor 502 and memory 504 for hosting a signal enhancement module 506 configured to implement various embodiments of signal enhancement as discussed in this disclosure. In one possible implementation, various audio equipment described herein may include all or portions of example device 500. Moreover, all or portions of signal processor 100 may be implemented using all or portions of example device 500 and/or various other functionality. For example, all or portions of transient shaping and expanding module 104, equalization enhancement module 106, summing amplifiers 108, 120 and excitation module 118 may be implemented in example device 500 (such as, for example, as various sub modules within signal enhancement module 506). Alternately, or additionally, some or all of transient shaping and expanding module 104, equalization enhancement module 106, summing amplifiers 108, 120 and excitation module 118 may be implemented through use of other functionality, such as electronic circuitry, etc.

Memory 504 can also host one or more databases and can include one or more forms of volatile data storage media such as random access memory (RAM), and/or one or more forms of nonvolatile storage media (such as read-only memory (ROM), flash memory, and so forth). In one possible implementation, memory 504 can store a variety of data discussed herein, including, for example, identification information, data measured by sensor(s) 304, etc.

Device 500 is one example of a computing device or programmable device, and is not intended to suggest any limitation as to scope of use or functionality of device 500 and/or its possible architectures. For example, device 500 can comprise one or more computing devices, programmable logic controllers (PLCs), etc.

Further, device 500 should not be interpreted as having any dependency relating to one or a combination of components illustrated in device 500. For example, device 500 may include one or more of a computer, such as a laptop computer, a desktop computer, a mainframe computer, a cell phone, an audio mixer, a musical instrument, a simple on chip computing device, etc., or any combination or accumulation thereof.

Device 500 can also include a bus 508 configured to allow various components and devices, such as processors 502, memory 504, and local data storage 510, among other components, to communicate with each other.

Bus 508 can include one or more of any of several types of bus structures, including a memory bus or memory controller, a peripheral bus, an accelerated graphics port, and a processor or local bus using any of a variety of bus architectures. Bus 508 can also include wired and/or wireless buses.

Local data storage 510 can include fixed media (e.g., RAM, ROM, a fixed hard drive, etc.) as well as removable media (e.g., a flash memory drive, a removable hard drive, optical disks, magnetic disks, and so forth).

One or more input/output (I/O) device(s) 512 may also communicate via a user interface (UI) controller 514, which may connect with I/O device(s) 512 either directly or through bus 508.

In one possible implementation, a network interface 516 may communicate outside of device 500 via a connected network, and in some implementations may communicate with hardware, etc.

In one possible embodiment, various equipment may communicate with device 500 as input/output device(s) 512 via bus 508, for example.

A media drive/interface 518 can accept removable tangible media 520, such as flash drives, optical disks, removable hard drives, software products, etc. In one possible implementation, logic, computing instructions, and/or software programs comprising elements of signal enhancement module 506 may reside on removable media 520 readable by media drive/interface 518.

In one possible embodiment, input/output device(s) 512 can allow a user to enter commands and information to device 500, and also allow information to be presented to the user and/or other components or devices. Examples of input device(s) 512 include, for example, sensors, a keyboard, a cursor control device (e.g., a mouse), a microphone, a scanner, a musical instrument, a pickup, and any other input devices known in the art. Examples of output devices include a display device (e.g., a monitor or projector), speakers, a printer, a network card, and so on.

Various processes of signal enhancement module 506 may be described herein in the general context of software or program modules, or the techniques and modules may be implemented in pure computing hardware. Software generally includes routines, programs, objects, components, data structures, and so forth that perform particular tasks or implement particular abstract data types. An implementation of these modules and techniques may be stored on or transmitted across some form of tangible computer-readable media. Computer-readable media can be any available data storage medium or media that is tangible and can be accessed by a computing device. Computer readable media may thus comprise computer storage media. "Computer storage media" designates tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer.

Although a few example embodiments have been described in detail above, those skilled in the art will readily appreciate that many modifications are possible in the example embodiments without materially departing from this disclosure. Accordingly, such modifications are intended to be included within the scope of this disclosure as defined in the following claims. Moreover, embodiments may be performed in the absence of any component not explicitly described herein.

In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" is intended to include "and/or" unless specifically indicated otherwise. The illustrative embodiments may be implemented as a method, apparatus, or article of manufacture using standard engineering techniques.

ILLUSTRATIVE EMBODIMENTS

The following embodiments are illustrative and are not intended to limit the scope of the disclosed subject matter.

Embodiment 1

A signal processor comprising:
a first signal path from an audio source including a first dynamic range expander and a lowpass filter;
a second signal path from the audio source including a second dynamic range expander and a highpass filter; and
a third signal path from the audio source.

Embodiment 2

The signal processor of embodiment 1, wherein the lowpass filter has an octave slope with a corner frequency correlated to a low-frequency rolloff point as defined by a selected frequency response curve.

Embodiment 3

The signal processor of embodiment 2, wherein the selected frequency response curve comprises the Fletcher-Munson curve and the low-frequency rolloff point comprises a low-frequency rolloff point in human hearing.

Embodiment 4

The signal processor of embodiment 1, wherein the selected frequency response curve is associated with one or more of:
human hearing;
a guitar pickup;
a bass guitar pickup.

Embodiment 5

The signal processor of embodiment 1, wherein the highpass filter has an octave slope with a corner frequency related to a high-frequency rolloff point as defined by a selected frequency response curve.

Embodiment 6

The signal processor of embodiment 5, wherein the selected frequency response curve comprises the Fletcher-Munson curve and the high-frequency rolloff point comprises a high-frequency rolloff point in human hearing Embodiment 7

The signal processor of embodiment 1, further including:
a summing amplifier configured to receive a first signal from the first signal path, a second signal from the second signal path, and a clear signal from the third signal path, and output a summed signal; and
an excitation module configured to receive the summed signal, the excitation module comprising:
a sharp highpass filter; and
a distortion unit configured to create high frequency harmonics.

Embodiment 8

The signal processor of embodiment 1, wherein the signal processor is configured to be used in conjunction with one or more of:
a public address system;
a hearing aid;
a telephone;
a speaker;
one or more headphones;
a computer;
a musical instrument;
a television;
an entertainment system.

Embodiment 9

The signal processor of embodiment 7, wherein the distortion unit is configured to create high-frequency harmonics in a 10-20 kHz range.

Embodiment 10

The signal processor of embodiment 1, wherein one or more of the first dynamic range expander and the second dynamic range expander are configured to implement dynamic range expansion based on a floating threshold.

Embodiment 11

The signal processor of embodiment 1, further comprising a summing amplifier configured to receive a first signal from the lowpass filter on the first signal path and a second signal from the highpass filter on the second signal path.

Embodiment 12

A piece of audio equipment comprising:
a first signal path including a first dynamic range expander and a lowpass filter;
a second signal path parallel to the first signal path, the second signal path including a second dynamic range expander and a highpass filter; and a summing amplifier configured to receive a first signal from the first signal path, a second signal from the second signal path, and a clear signal, and output a summed signal.

Embodiment 13

The piece of audio equipment of embodiment 12, wherein the lowpass filter has an octave slope with a corner frequency correlated to a low-frequency rolloff point in human hearing, and further wherein the highpass filter has an octave slope with a corner frequency correlated to a high-frequency rolloff point in human hearing.

Embodiment 14

The piece of audio equipment of embodiment 12, wherein the audio equipment comprises one or more of:
a public address system;
a hearing aid;
a telephone
a speaker;
one or more headphones;
a computer;
a musical instrument;
a television;
an entertainment system.

Embodiment 15

The piece of audio equipment of embodiment 12, wherein the lowpass filter has an octave slope with a corner frequency correlated to a low-frequency rolloff point as defined by a selected frequency response curve.

Embodiment 16

The piece of audio equipment of embodiment 12, further including an excitation module configured to receive the summed signal, the excitation module comprising:
a sharp highpass filter; and
a distortion unit configured to create high frequency harmonics.

Embodiment 17

A computer-readable tangible medium with instructions stored thereon that, when executed, direct a processor to perform acts comprising:
dynamically expanding the range of a signal received from an audio source to create a dynamically expanded signal;
filtering the dynamically expanded signal through a lowpass filter to create a first processed signal; and
filtering in parallel the dynamically expanded signal through a highpass filter to create a second processed signal.

Embodiment 18

The computer-readable medium of embodiment 17, further including instructions to direct a processor to perform acts comprising:
filtering the dynamically expanded signal through the lowpass filter using an octave slope with a corner frequency correlated to a low-frequency rolloff point in human hearing to create the first processed signal; and
filtering the dynamically expanded signal through the highpass filter using an octave slope with a corner frequency correlated to a high-frequency rolloff point in human hearing to create the second processed signal.

Embodiment 19

The computer-readable medium of embodiment 17, further including instructions to direct a processor to perform acts comprising:
summing the first processed signal, the second processed signal, and a clean signal from the audio source into a summed signal; and
exciting the summed signal by filtering it with a sharp highpass filter and distorting the summed signal to create high frequency harmonics.

Embodiment 20

The computer-readable medium of embodiment 17, further including instructions to direct a processor to perform acts comprising:
regulating the dynamic expanding of the range of the signal in accordance with a floating threshold.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated. It is intended that the scope of the disclosed subject matter be defined by the claims appended hereto and their equivalents.

What is claimed is:

1. A signal processor comprising:
a first signal path from an audio source including a first dynamic range expander and a lowpass filter;
a second signal path from the audio source including a second dynamic range expander and a highpass filter; and
a third signal path from the audio source, wherein the first dynamic range expander is configured to process an audio signal on the first signal path and the second dynamic range expander is configured to process the audio signal simultaneously and in parallel on the second signal path.

2. The signal processor of claim 1, wherein the lowpass filter has an octave slope with a corner frequency correlated to a low-frequency rolloff point as defined by a selected frequency response curve.

3. The signal processor of claim 2, wherein the selected frequency response curve comprises the Fletcher-Munson curve and the low-frequency rolloff point comprises a low-frequency rolloff point in human hearing.

4. The signal processor of claim 2, wherein the selected frequency response curve is associated with one or more of:
human hearing;
a guitar pickup;
a bass guitar pickup.

5. The signal processor of claim 1, wherein the highpass filter has an octave slope with a corner frequency related to a high-frequency rolloff point as defined by a selected frequency response curve.

6. The signal processor of claim 5, wherein the selected frequency response curve comprises the Fletcher-Munson curve and the high-frequency rolloff point comprises a high-frequency rolloff point in human hearing.

7. The signal processor of claim 1, further including:
a summing amplifier configured to receive a first signal from the first signal path, a second signal from the second signal path, and a clear signal from the third signal path, and output a summed signal; and
an excitation module configured to receive the summed signal, the excitation module comprising:
a sharp highpass filter; and
a distortion unit configured to create high frequency harmonics.

8. The signal processor of claim 1, wherein the signal processor is configured to be used in conjunction with one or more of:
a public address system;
a hearing aid;
a telephone;
a speaker;
one or more headphones;
a computer;
a musical instrument;
a television;
an entertainment system.

9. The signal processor of claim 7, wherein the distortion unit is configured to create high-frequency harmonics in a 10-20 kHz range.

10. The signal processor of claim 1, wherein one or more of the first dynamic range expander and the second dynamic range expander are configured to implement dynamic range expansion based on a floating threshold.

11. The signal processor of claim 1, further comprising a summing amplifier configured to receive a first signal from the lowpass filter on the first signal path and a second signal from the highpass filter on the second signal path.

12. A piece of audio equipment comprising:
a first signal path including a first dynamic range expander and a lowpass filter, wherein the first dynamic range expander is configured to receive an audio signal on the first signal path;
a second signal path parallel to the first signal path, the second signal path including a second dynamic range expander and a highpass filter, wherein the second dynamic range expander is configured to receive the audio signal simultaneously and in parallel on the second signal path; and
a summing amplifier configured to receive a first signal from the first signal path, a second signal from the second signal path, and the audio signal, and output a summed signal.

13. The piece of audio equipment of claim 12, wherein the lowpass filter has an octave slope with a corner frequency correlated to a low-frequency rolloff point in human hearing, and further wherein the highpass filter has an octave slope with a corner frequency correlated to a high-frequency rolloff point in human hearing.

14. The piece of audio equipment of claim 12, wherein the audio equipment comprises one or more of:
a public address system;
a hearing aid;
a telephone
a speaker;
one or more headphones;
a computer;
a musical instrument;
a television;
an entertainment system.

15. The piece of audio equipment of claim 12, wherein the lowpass filter has an octave slope with a corner frequency correlated to a low-frequency rolloff point as defined by a selected frequency response curve.

16. The piece of audio equipment of claim 12, further including an excitation module configured to receive the summed signal, the excitation module comprising:
a sharp highpass filter; and
a distortion unit configured to create high frequency harmonics.

17. A non-transitory computer-readable tangible medium with instructions stored thereon that, when executed, direct a processor to perform acts comprising:
dynamically expanding the range of a signal received from an audio source to create a dynamically expanded signal;
filtering the dynamically expanded signal through a lowpass filter to create a first processed signal; and
filtering in parallel the dynamically expanded signal through a highpass filter to create a second processed signal.

18. The non-transitory computer-readable tangible medium of claim 17, further including instructions to direct a processor to perform acts comprising:
filtering the dynamically expanded signal through the lowpass filter using an octave slope with a corner frequency correlated to a low-frequency rolloff point in human hearing to create the first processed signal; and
filtering the dynamically expanded signal through the highpass filter using an octave slope with a corner frequency correlated to a high-frequency rolloff point in human hearing to create the second processed signal.

19. The non-transitory computer-readable tangible medium of claim 17, further including instructions to direct a processor to perform acts comprising:
summing the first processed signal, the second processed signal, and the signal received from the audio source into a summed signal; and
exciting the summed signal by filtering it with a sharp highpass filter and distorting the summed signal to create high frequency harmonics.

20. The non-transitory computer-readable tangible medium of claim 17, further including instructions to direct a processor to perform acts comprising:
regulating the dynamic expanding of the range of the signal in accordance with a floating threshold.

* * * * *